US006931498B2

(12) United States Patent
Talreja et al.

(10) Patent No.: US 6,931,498 B2
(45) Date of Patent: Aug. 16, 2005

(54) STATUS REGISTER ARCHITECTURE FOR FLEXIBLE READ-WHILE-WRITE DEVICE

(75) Inventors: Sanjay S. Talreja, Folsom, CA (US); Jason Panavich, Austin, TX (US); Ramkarthik Ganesan, Fair Oaks, CA (US); Terry L. Kendall, Diamond Springs, CA (US)

(73) Assignee: Intel Corporation, Santa Clara, CA (US)

( * ) Notice: Subject to any disclaimer, the term of this patent is extended or adjusted under 35 U.S.C. 154(b) by 445 days.

(21) Appl. No.: 09/827,134

(22) Filed: Apr. 3, 2001

(65) Prior Publication Data

US 2002/0144066 A1 Oct. 3, 2002

(51) Int. Cl.[7] ................................................ G06F 12/00
(52) U.S. Cl. ......................... 711/154; 711/5; 711/103; 711/156; 711/168; 711/169; 711/173
(58) Field of Search ................................. 711/103, 154, 711/156, 173, 171, 172, 5, 168, 169

(56) References Cited

U.S. PATENT DOCUMENTS

| 5,765,017 | A | * | 6/1998 | Hoy et al. ..................... 712/23 |
| 5,867,430 | A | * | 2/1999 | Chen et al. ............. 365/189.04 |
| 5,954,828 | A | * | 9/1999 | Lin ............................. 714/723 |
| 5,995,415 | A | * | 11/1999 | Kuo et al. ............. 365/185.11 |
| 6,088,264 | A | * | 7/2000 | Hazen et al. ........... 365/185.11 |
| 6,182,189 | B1 | * | 1/2001 | Alexis et al. ................ 711/103 |
| 6,260,103 | B1 | * | 7/2001 | Alexis et al. ................ 711/103 |
| 2001/0011318 | A1 | * | 8/2001 | Dalvi et al. .................. 711/103 |
| 2002/0095545 | A1 | * | 7/2002 | Dalvi et al. .................. 711/103 |

* cited by examiner

Primary Examiner—Mano Padmanabhan
Assistant Examiner—Jasmine Song
(74) Attorney, Agent, or Firm—Cynthia T. Paatz

(57) ABSTRACT

A single status register, capable of providing status for simultaneous read-while-write operation on a flash memory array is described. The status of the memory array is reported to the user based on two partitions. A microcontroller is used to traffic the status register to memory array communication.

12 Claims, 4 Drawing Sheets

| DWS | PWS | Description |
|---|---|---|
| 0 | 0 | Addressed partition is performing Program/Erase operation. No other partition is active. |
| 0 | 1 | A partition other than the one currently addressed is performing a program/erase operation. |
| 1 | 0 | No program/erase operation is in progress in any partition. Erase and program suspend bits indicate whether other partitions are suspended. |
| 1 | 1 | Will not occur in standard program or erase mode. |

Figure 4

STATUS REGISTER ARCHITECTURE FOR FLEXIBLE READ-WHILE-WRITE DEVICE

FIELD OF THE INVENTION

The present invention pertains to the field of flash memory. More particularly, the present invention relates to a status register architecture for flexible read-while-write device that may be used in a flash memory.

BACKGROUND OF THE INVENTION

Flash memory is used in a wide variety of products including many types of computing, communication, and consumer electronic devices. Flash memory is a type of nonvolatile memory. Flash memory typically includes one or more memory arrays. Each memory array is comprised of multiple planes of fixed storage capacity. For example, a 16 Mb memory array may be made up of four 4 Mb planes. Operations such as programming, erasing, and reading may be performed on the memory cells within the memory array. Moreover, in a read-while-write architecture, it is possible for a given memory cell within a single array to be read while another is written to simultaneously.

In one past approach, each memory array is divided into at least two partitions of fixed size. Each partition of the memory array has a designated status register, which reports status information to the user. Thus, during a write operation, that partition's status information is output to its designated status register until another command is issued. A user may read any one of the given status registers to determine what valid operations can be performed on that particular partition. The only way to know which operations may be performed on the memory array is to track each status register. As an example, for a 16 Mb device having four 4 Mb planes in a read-while-write approach, the user would have to read 4 status registers to know which operations may be performed on each partition after the current operation is completed.

Other implementations require more than two memory partitions. For example, a read-while-write-while-write functionality would require three partitions. This enables a read operation to occur, while two write operations are occurring simultaneously to the same memory array. Also, to enlarge a memory array that includes fixed sized planes, more status registers would typically need to be added to accommodate the new memory planes. As the number of planes increases, the number of status registers to be maintained increases since each plane typically requires its own status register. Increasing the number of status registers that are formed on a chip typically requires using additional die area.

BRIEF DESCRIPTION OF THE DRAWINGS

The present invention is illustrated by way of example and not limitation in the figures of the accompanying drawings, in which like references indicate similar elements and in which:

FIG. 4 shows a table with all combinations of the device write/erase status and partition write status signals used in one embodiment of a read-while-write architecture.

DETAILED DESCRIPTION

A read-while-write (RWW) functionality allows read and write operations to a memory array to occur simultaneously as long as those operations are performed in different partitions of the memory array. Such a memory array is divided into planes. Unlike certain prior art devices, which require a status register of multiple bits for each memory partition, the memory array of an embodiment of the invention requires only a single status register of multiple bits. The single status register will be used to monitor more than one partition. Logical OR operations are used to make possible one status register to replace multiple status registers in achieving the same overall functionality. When used with a memory device that performs a function such as RWW, a single status register may enable decreased die size, improved performance, and increased robustness of the memory device.

Figure 1:
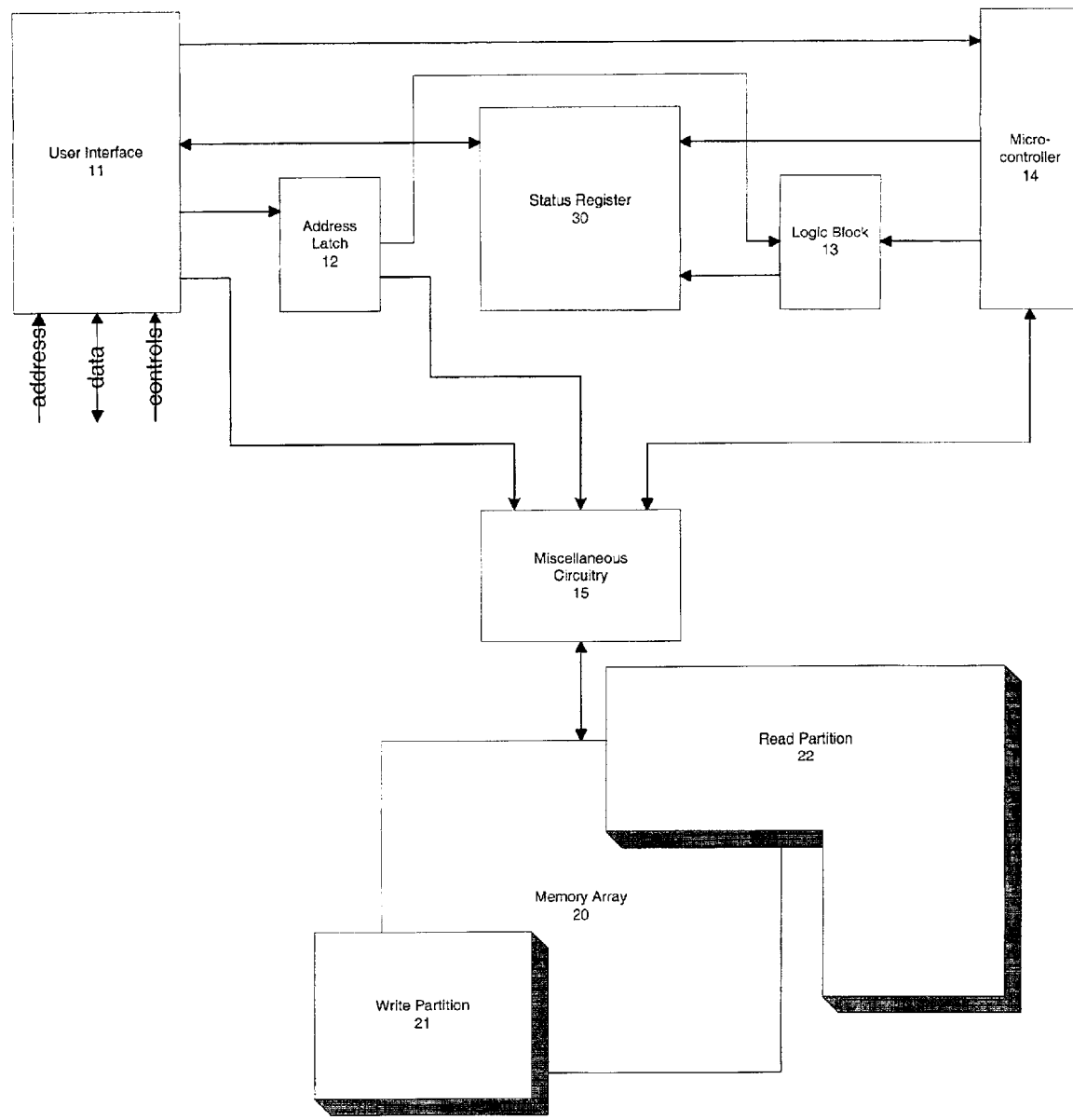
FIG. 1 shows a block diagram that illustrates an embodiment of a memory device that includes a status register of the present invention.

FIG. 1 depicts a block diagram of a system that includes a status register 30, which can enable read-while-write functionality for a memory array 20. Aside from the status register 30 and memory array 20, the system includes a user interface 11, an address latch 12, a logic block 13, a microcontroller 14, and miscellaneous circuitry 15. The microcontroller 14 controls the status register 30 by determining operations such as when to program and erase portions of the memory array 20 or when to guard against memory access when a given address is busy. The microcontroller, depending on its state of operation, will enter the status information into the status register.

The user interface 11 inputs addresses through an address bus, inputs and outputs data through a data bus, and inputs control signals through a control bus. An address from the address bus is processed and sent to an address latch 12 where the information is synchronized with respect to an internal clock. The output of the address latch 12 is subsequently sent to a logic block 13 before the address is ultimately presented to the status register 30.

The control signals are supplied to the user interface 11 before being sent to the microcontroller along with data. The microcontroller 14 then uses that information to further supply control signals to the status register 30, logic block 13, and miscellaneous circuitry 15. The miscellaneous circuitry 15 includes decoders, pumps, and locking circuits. In addition, miscellaneous circuitry 15 transmits information to and from the memory array 20. Hence, the connection between the miscellaneous circuitry 15 and the microcontroller 14 is bidirectional because data read from memory is sent from the miscellaneous circuitry 15 to the microcontroller 14. When data is read, the microcontroller 14 delivers the information requested to the user interface 11 through the status register 30.

Figure 2:
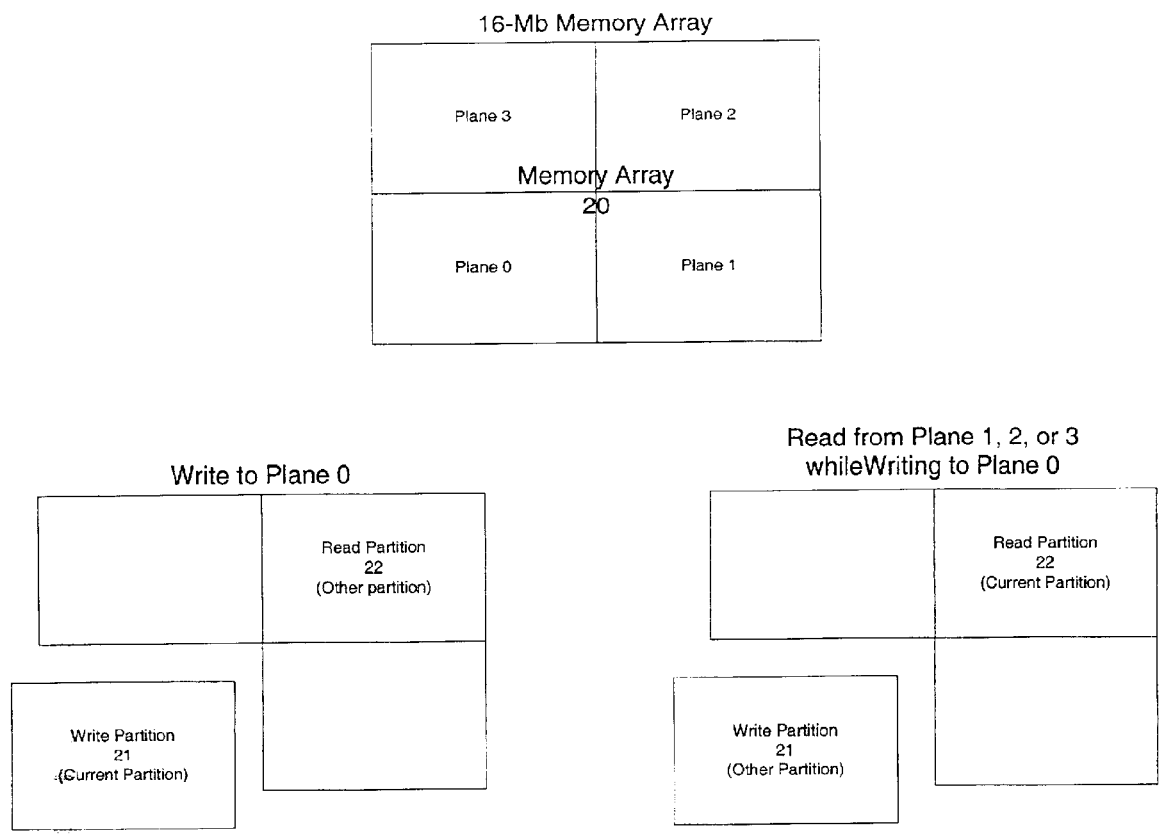
FIG. 2 shows a flash memory array with partitions that enables read-while-write operation using a single status register.

FIG. 2 shows a memory array 20 divided into n planes, where n is equal to four in this case. In one embodiment of the invention, each plane comprises 4 Mb of memory. Thus, the memory array 20 consists of 16 Mb of memory. Regardless of the number of 4 Mb planes, the status register 30 of the present invention enables the status of memory array 20 to be reported to the user through a user interface based on two partitions of flexible size. The partitions will consist of a fixed Write partition 21 and a variable Read partition 22. In one example, the Write partition 21 is a single plane, or 4 Mb of memory, in which a program or erase operation is taking place. The other partition, the Read partition 22, consists of the remaining planes. Although the partitions are referred to as the Read and Write partitions, the address range for each partition is dynamic, changing any time a program or erase operation begins or resumes in a new plane. If no program or erase operation is being performed, there is essentially only a single partition, in which any operation may be conducted.

Multiple memory array partitions are useful when the flash memory array 20 is capable of being accessed by more than one processor. Each processor may independently perform different sets of operation. For example, multiple partitions enable one processor to write information to memory, while the other processor reads or executes another command at the same time. This is not possible in a single partition device where a first processor that wishes to perform an operation issues a first command. If a second processor wants to perform a second operation immediately, the second processor would have to suspend the first operation, perform the second operation, and then resume the first operation after the second operation is completed. As a result, performance in a system having only one partition is inefficient. Multiple partitions make it possible to perform multiple tasks at the same time, as long as the operations on the device are located in different partitions of the memory device 20.

Performance gains will be especially significant in systems that perform many writing and reading operations. A typical suspend latency is in the 25–30 microsecond (usec) range. This represents a substantial amount of time for waiting every time a suspend command is issued. Erase operations are an even greater bottleneck, taking up to one second to complete. Thus, in the former design, when a part is erased, either the system would have to wait for the entire operation to complete or the system would have to issue a command suspension before another operation could be performed.

In the present RWW scheme, memory devices are broken into two partitions so if one processor requests to write information, the processor will issue the write command; internally, the flash memory starts writing into one of the partitions. If another processor requests to read data from another memory partition, the memory array can read data from the memory array 20, while continuing to write data without interruption. Similarly, if one partition is busy with an erase operation, the system could simply switch partitions and start doing a read operation at the same time instead of having to suspend the former operation or wait for the erase operation to complete. Even though this example is for only two partitions, this invention is not limited to two partitions.

Figure 3:
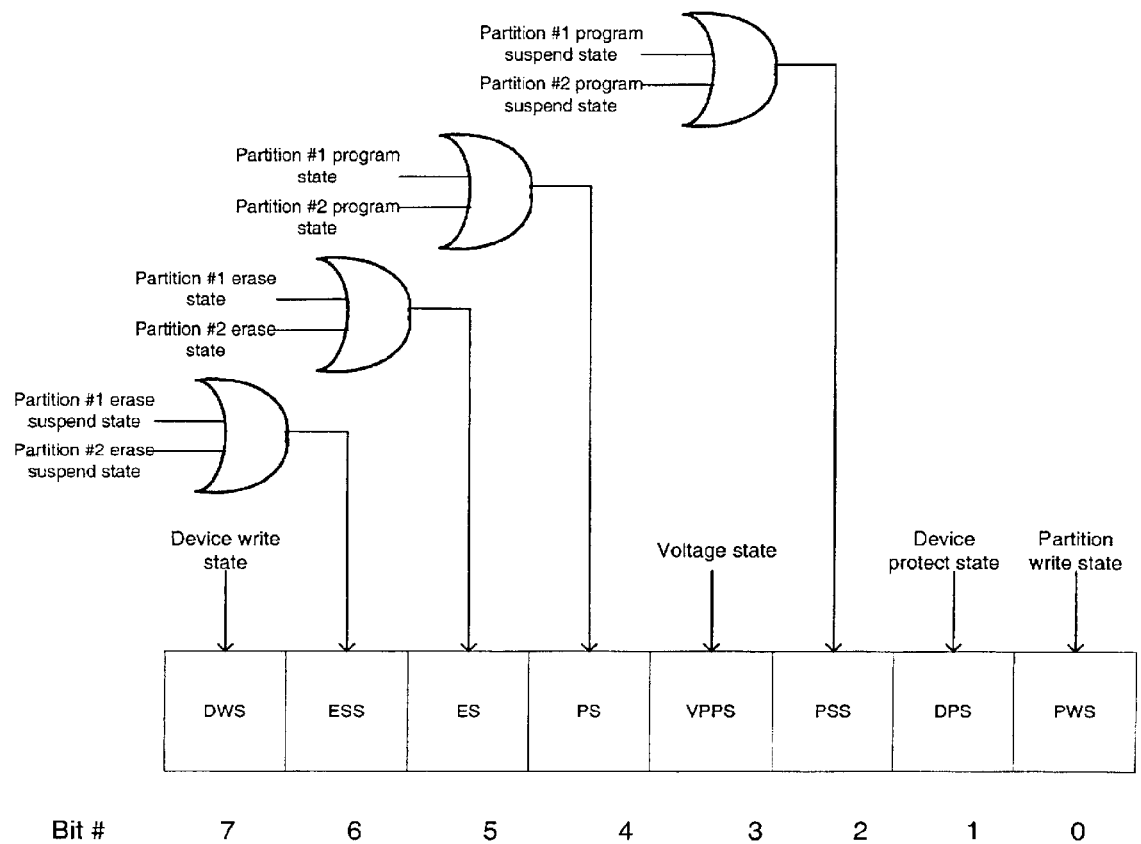
FIG. 3 shows an embodiment of the status register of the present invention that may be used with multiple partitions.

FIG. 3 depicts one embodiment of a status register 30 definition. The status register has eight binary bits. It provides necessary status of all memory planes by monitoring the device write/erase status (DWS), partition write status (PWS), erase status (ES), erase suspend status (ESS), program status (PS), program suspend status (PSS), device protect status (DPS), and voltage level (VPPS). Although FIG. 3 shows DWS mapped to bit 7, ESS mapped to bit 6, ES mapped to bit 5, PS mapped to bit 4, VPPS mapped to bit 3, PSS mapped to bit 2, DPS mapped to bit 1, and PWS mapped to bit 0, the exact assignment of each status signal to the eight binary bits is of no significance. As an example, DWS could have been mapped to bit 6 just as easily as it was mapped to bit 7. Moreover, other status signals may be added to the status register 30 if monitoring additional signals is desirable in other embodiments.

The most recently addressed partition is the current partition. The current partition depends on what address is provided to the status register. For this embodiment of the invention, the current partition may be either the WRITE partition or the READ partition. This implementation is different from the previous designs, wherein single partition devices are address independent.

FIG. 4 provides the possible combinations of the DWS and PWS signals. DWS gives information regarding block erase or program completion in the device. An active high signal for DWS indicates that the device is ready for a command, while an active low signal is an indication that the device is busy. PWS is used to determine block erase or program executions in the current partition. Similar to DWS, an active high signal indicates that the current block is ready, while an active low signal indicates that the current block is busy. For example, if a user reads the status register and DWS indicates that there is a program/erase operation happening somewhere and PWS indicates that the current partition is not performing a program/erase operation, the current partition can safely perform a read operation because the current partition is not the WRITE partition. If the above example were the same except PWS indicates that the current partition is performing a program/erase, this would inform the user a read operation is unable to be issued in the partition since the current partition is the WRITE partition.

The remaining status register bits (ES, ESS, PS, PSS, DPS, and VPPS) further provide partition information but do not distinguish which specific partition the information is coming from. The bits are wired-OR for all of the planes in the array. As a result, regardless of which partition is the current partition, the remaining status bits provide information for anywhere in the device. Specifically, the ES bit gives information regarding the block being erased. An active high ES bit signifies that the Write State Machine (WSM) has attempted but failed to erase the block. Alternatively, when an active low ES bit is an indication that the block has been successfully erased. When an erase suspend command is issued in the current partition, the WSM halts execution and sets both DWS and ESS active high. ESS remains active high until an erase resume command is issued. ESS is set low when the block erase is in progress or completed. The PS bit gives program status information. When the PS bit is asserted active high, the WSM has attempted but failed to program a word. Asserted low, the PS bit indicates the WSM has successfully programmed a word. When a program suspend command is issued in the current partition, the WSM halts execution and sets both DWS and PSS active high. PSS remains set until a program resume command is issued.

Two-input OR-gates are depicted in FIG. 3 as inputs to the ES, ESS, PS, and PSS inputs. Each OR-gate has only two inputs because the current example only consists of a two partition memory array. However, if the memory array is divided into more than two memory arrays, the inputs to the OR-gates would simply be increased to reflect the number of partitions. Thus, a three partition memory device would require three input OR-gates. The ES, ESS, PS, and PSS bits are designed to monitor the status of all the partitions.

If a block erase or program operation is attempted to a locked memory block, DPS remains set by the WSM. The operation is aborted and the device is returned to the read status mode. Finally, the WSM interrogates the voltage level Vpp after a block erase or program operation. The WSM then informs the system if Vpp has been switched on.

By monitoring both the current partition and other partitions, the current design saves die area because a single status register does the work that previously required multiple status registers. The technique of using one status register 30 is independent of partition sizes and the number of partitions. Moreover, the technique of using one status register 30 makes designs more robust by becoming more readily adaptable to large arrays, multiple partitions, or small partitions of flash cells. For example, previous designs might have required multiple partitions for a large memory array, which in turn would have required multiple status registers that would have taken up valuable chip area. Because the current design only has one status register, the current design avoids area limitations of previous designs associated with large memory arrays and multiple partitions, while still being able to work with chips having limited partitions of a small flash memory array.

If the status register is being used to monitor multiple partitions, information may be presented from a combination of several partitions. The single status register is able to handle the information by combining commands. For example, in a read-while-write device, if an erase or program suspend status is received through the ESS or PSS bits, irrespective of which other partition the suspend command is coming from, an erase or program command can be made in the current partition. It is not important to know which specific partition is suspended. More importantly, the current partition status is known and it can be determined from this information what valid commands may be issued next. The single status read effectively relays to the customer all the information needed to be able to determine valid operations in the current partitions. This feature may potentially be extended to functions like read-while-write-while-write in the future.

In effect, the status register is used as a handshaking device. For example, when an array is accessed by two processors, and those two processors do not communicate with each other, the status register determines when and if each processor may perform a given operation. Each processor can read information from the status register, irrespective of what the other processor is doing. From this information, each processor can determine what valid operation the processor can perform. In this system example with two processors, each processor is only interested in its own partition and does not rely on any information from the other partition.

In the foregoing specification, the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. An integrated circuit comprising:
    a memory array having at least a first plane and a second plane, wherein a first partition of the memory array comprises one of the planes and a second partition of the memory array comprises the remaining planes, wherein a write operation is to be performed on the first partition and a read operation is to be concurrently performed on the second partition; and
    a status register coupled to the memory array, wherein the status register is to provide status information for at least the first and second partition, the statue register being responsive to a memory address associated with one of the first and second partitions to indicate a status of the addressed partition.

2. The integrated circuit of claim 1, further comprising:
    a microcontroller coupled to the status register, wherein the microcontroller supplies control signals to the status register.

3. The integrated circuit of claim 2, further comprising:
    an user interface coupled to the status register, wherein the user interface is to communicate status register information to be used to decide subsequent operations.

4. The integrated circuit of claim 1, wherein the at least first and second planes comprise substantially equal memory storage capacities.

5. A method of reading while writing to a memory array, comprising:
    dividing the memory array into n planes, wherein n is an integer greater than one;
    defining a write partition, wherein the write partition is a single plane of the memory array;
    defining a read partition, wherein the read partition is made up of all of the remaining n-1 plane, of the memory array; and
    providing the status of the read partition and the write partition of the memory array with a single status register, wherein providing the status includes providing the status of the read partition responsive to receiving an address associated with the read partition and providing the status of the write partition responsive to receiving an address associated with the write partition.

6. The method of claim 5, wherein the memory array consists of multiple memory planes having substantially equal storage capacity.

7. The method of claim 6, wherein the multiple memory planes consist of nonvolatile memory cells.

8. The method of claim 7, wherein the nonvolatile memory cell is a flash memory cell.

9. The method of claim 6, wherein the writs partition has a dynamic memory address, wherein the memory address changes any time a program or erase operation begins or resumes in a new memory piano.

10. The method of claim 6, wherein if no program or erase operation is performed, the read partition and the write partition are allocated to the same memory location.

11. An apparatus comprising:
    means for partitioning a memory array into a fixed first partition and a variable second partition to enable multiple operations to be performed on the memory array at the same time; and
    means for monitoring the operations performed on the memory array, the means for monitoring including a register to provide status information for at least the first and second partition, the status register being responsive to a memory address associated with one of the first and second partitions to indicate a status of the addressed partition.

12. The apparatus of claim 11 further comprising a means for communicating the status of the operations performed on the memory array to a user.

* * * * *

UNITED STATES PATENT AND TRADEMARK OFFICE
CERTIFICATE OF CORRECTION

PATENT NO. : 6,931,498 B2
DATED : August 16, 2005
INVENTOR(S) : Talreja et al.

It is certified that error appears in the above-identified patent and that said Letters Patent is hereby corrected as shown below:

<u>Column 6,</u>
Line 40, delete "writs" and insert -- write --.
Line 43, delete "piano." and insert -- plane. --.

Signed and Sealed this

Eighteenth Day of October, 2005

JON W. DUDAS
*Director of the United States Patent and Trademark Office*